United States Patent [19]
Hirayama et al.

[11] Patent Number: 5,375,137
[45] Date of Patent: Dec. 20, 1994

[54] SEMICONDUCTOR LASER DEVICE FEATURING GROUP III AND IV COMPOUNDS DOPED WITH AMPHOTERIC IMPURITY TO VARY ELECTRICAL RESISTANCE ACCORDING TO DIRECTION OF CRYSTAL PLANE

[75] Inventors: Yoshiyuki Hirayama; Hitoshi Shimizu; Sumio Sugata, all of Yokohama, Japan

[73] Assignee: The Furukawa Electric Co., Ltd., Tokyo, Japan

[21] Appl. No.: 932,181

[22] Filed: Aug. 21, 1992

[30] Foreign Application Priority Data

Aug. 22, 1991 [JP] Japan .................. 3-237197

[51] Int. Cl.$^5$ ............................................. H01S 3/19
[52] U.S. Cl. ...................................... 372/46; 372/45
[58] Field of Search ................................ 372/46, 45

[56] References Cited

U.S. PATENT DOCUMENTS 5,271,028  12/1993  Kondo et al. .................... 372/46

OTHER PUBLICATIONS

"High-power fundamental mode AlGaAs quantum well channeled sub substrate laser grown by molecular beam epitaxy", Jaeckel et al., Appl. Phys. lett 55(11), Sep. 11, 1989, pp. 1059–1061.

"Inner–Stripe AlGaAs/GaAs Laser Diode by Single–Step Molecular Beam Epitaxy", Imanaka et al., Electronics Letters, Feb. 26, 1987, vol. 23, No. 5, pp. 209–210.

Primary Examiner—James W. Davie
Attorney, Agent, or Firm—Jacobson, Price, Holman & Stern

[57] ABSTRACT

There is provided a high-quality semiconductor laser device having a current confinement feature along with a method of manufacturing the same in a simple manner. The upper clad layer 4 of a semiconductor laser device is a semiconductive layer made of a compound of elements of the III and V groups doped with an amphoteric impurity substance and the electric resistance of the lateral slopes is greater on the top of the mesa than on the upper clad layer 4 of the mesa. A method of manufacturing a semiconductor laser device comprises a step of repeating a cycle of crystal growth operation of sequentially forming a layer of an element of the III group, a layer of an amphoteric impurity substance and a layer of an element of the V group on said substrate by means of an MBE technique to produce said upper clad layer made of a compound of elements of the III and V groups.

11 Claims, 5 Drawing Sheets

SEMICONDUCTOR LASER DEVICE FEATURING GROUP III AND IV COMPOUNDS DOPED WITH AMPHOTERIC IMPURITY TO VARY ELECTRICAL RESISTANCE ACCORDING TO DIRECTION OF CRYSTAL PLANE

BACKGROUND OF THE INVENTION

1. Technical Field

This invention relates to a semiconductor laser device using a solid and a method of manufacturing the same.

2. Prior Art

Compound semiconductor laser devices are popularly used as solid-state semiconductor light emitting devices in the field of optical telecommunication and other optical technologies.

Semiconductor laser devices used for these applications are normally provided with a feature of confining the electric current running therethrough in order to reduce the threshold current level when starting laser oscillation.

FIG. 9 of the accompanying drawings schematically illustrates a semiconductor laser device having such a current confinement feature.

A semiconductor laser device as illustrated in FIG. 9 comprises an n-InP lower clad layer 12, an n-InGaAs active layer 13, a p-InP upper clad layer 14, a p-InP layers 15, an n-InP layers 16, said p-InP layers 15 and n-InP layers 16 being provided as electric current blocking layers, a p-GaInAsP contact layer 17 and an insulation layer 18 arranged on an n-InP substrate 11 in the above-mentioned order to form a multilayered structure, on the upper and lower surfaces of which a p-electrode 19 and an n-electrode 10 are respectively mounted.

A semiconductor laser device having a structure as shown in FIG. 9 is produced through a process as described below.

In the first step of crystal growth operation, the n-InP lower clad layer 12, the n-InGaAs active layer 13 and the p-InP upper clad layer 14 are sequentially formed on a substrate 11 by means of an MBE technique and thereafter the obtained intermediary multilayered structure is etched at a predetermined location to narrow the active layer 13.

Then, in the second step of crystal growth operation, the p-InP layer 15 and the n-InP layer 16 are sequentially formed as electric current blocking layers on the intermediary multilayered structure by means of an LPE technique.

Finally, in the third step of crystal growth operation, the p-InGaAs contact layer 17 is formed atop by means of an MBE technique.

A semiconductor laser device produced in a manner as described above can effectively confine the electric current running therethrough by utilizing the current blocking layers 15 and 16 of the pn reverse junction type formed on the opposite lateral sides of the active layer 13.

Another semiconductor laser device also having a current confinement feature is illustrated in FIG. 10.

A semiconductor laser device as illustrated in FIG. 10 comprises an n-InP lower clad layer 22, an n-InGaAs active layer 24 having its upper and lower surfaces covered by respective GaAs buffer layers 23 and 25, an Si-doped n-AlGaAs upper clad layer 26, a GaAs contact layer 27 and an SiO$_2$ insulation layer 28 arranged on a p-GaAs substrate 21 in the above mentioned order to form a multilayered structure, on the upper and lower surfaces of which an n-electrode 29 and a p-electrode 20 are respectively mounted.

The p-GaAs substrate 21 of the semiconductor laser device of FIG. 10 has different surface levels as it has a mesa between a pair of flat and low side areas.

The flat surface of the highest central area of the mesa has a (100) plane, whereas the lateral slopes of the mesa connecting the higher level and the lower level have a (311) A plane.

Since the dopant Si of the n-AlGaAs upper clad layer 26 of the semiconductor laser device of FIG. 10 is an amphoteric impurity substance, the (100) plane of the layer is of n-type, whereas the (311) A plane of the layer is of p-type.

With such an arrangement, a pn junction is formed within the Si-doped n-AlGaAs upper clad layer 26 to block any transversal electric currents that may flow therein.

Besides, the electric current confinement structure of the semiconductor laser device illustrated in FIG. 10 can be formed by a single epitaxial growth operation.

3. Problems to be Solved by the Invention]

Semiconductor laser devices such as those illustrated in FIGS. 9 and 10 are accompanied by the following problems that remain unsolved.

(1) A mesa etching step is inevitably required in the process of crystal growth for forming the layers of a semiconductor laser device as illustrated in FIG. 9. This means that the process of crystal growth needs to be interrupted, consequently making the operation of controlling the overall process of manufacturing such a semiconductor laser device rather complicated.

(2) The use of a different material for a semiconductor laser device as illustrated in FIG. 19 inevitably results in the failure of providing it with a current confinement feature.

For instance, if an InAlAs clad layer and an InGaAs active layer are formed on an InP substrate having different surface levels, while the (100) plane of the substrate is turned to n-type by doping the InAlAs clad layer with Si, the (111) A plane that needs to become p-type is also turned to n-type having a degree of carrier concentration similar to that of the (100) plane.

Thus, a current confinement operation cannot be successfully carried out by means of pn junction if a laser structure is formed on the (100) plane of the InP structure that also has a (111) A plane or a (311) A plane.

In view of the above described technological problems, it is therefore an object of the present to provide an advanced high-quality semiconductor laser device having a current confinement feature as well as a method of manufacturing the same in a simple manner.

SUMMARY OF THE INVENTION

According to the present invention, the above object is achieved by providing a semiconductor laser device comprising a lower clad layer, an active layer and an upper clad layer formed on a normal mesa-shaped substrate, said upper clad layer being a semiconductive layer made of a compound of elements of the III and V groups doped with an amphoteric impurity substance, the electric resistance of the lateral slopes of the mesa being greater on the top of the mesa than on said upper clad layer of the mesa by more than 10$^2$ times.

According to the present invention, the above object is also achieved by providing a method of manufacturing a semiconductor laser device having a lower clad layer, an active layer and an upper clad layer formed on a normal mesa-shaped substrate comprising a step of repeating a cycle of crystal growth operation of sequentially forming a layer of an element of the III group, a layer of an amphoteric impurity substance and a layer of an element of the V group on said substrate by means of an MBE technique to produce said upper clad layer made of a compound of elements of the III and V groups.

The present invention is based on a new scientific discovery that when a semiconductor made of a compound of elements of the III and V groups having differently directed crystal planes is doped with an amphoteric impurity substance, the electric resistance of the semiconductor varies depending on the direction of crystal plane.

The phenomenon may be explained by the fact that when the sites of atoms of the element of the III group are doped with an amphoteric impurity substance, the latter becomes of n-type, that when the sites of atoms of the element of the V group are doped with the same amphoteric impurity substance, the latter becomes of p-type and that, when the two sites are doped with a same amphoteric impurity substance to a same extent, the impurities on the two sites compensate each other to show a high-electric resistance.

Although atoms of an amphoteric impurity substance normally enters the sites of atoms of an element of the III group and not the sites of atoms of an element of the V group if sites of two different types exist, the amphoteric impurity may enter the sites of atoms the element of the V group if a stabilizing plane of the element of the III group is artificially formed and doped with the amphoteric impurity.

The above phenomenon is utilized in a semiconductor laser device according to the invention in a manner as described below.

When an upper clad layer is formed on a normal mesa-shaped substrate (having a trapezoidal cross section), the direction of crystal plane of the upper clad layer on the top of the mesa is different from that of the upper clad layer on the lateral slopes of the mesa. Moreover, if such an upper clad layer is appropriately doped with an amphoteric impurity substance, the sites through which atoms of the amphoteric impurity substance enter and the electric resistance of the upper clad layer on the top of the mesa respectively differ from those on the lateral slopes of the mesa.

Thus, a semiconductor laser device according to the invention and having an electric resistance which is greater on the lateral slopes than on the upper layer of the mesa can effectively confine the injected electric current on the top of the mesa.

A method of manufacturing a semiconductor laser device having a lower clad layer, an active layer and an upper clad layer formed on a substrate according to the present invention comprises a step of repeating a cycle of crystal growth operation of sequentially forming a layer of an element of the III group, a layer of an amphoteric impurity substance and a layer of an element of the V group on said substrate by means of an MBE technique to produce said upper clad layer made of a compound of elements of the III and V groups.

With such an arrangement, since the probability with which atoms of the amphoteric impurity substance are combined with atoms of the element of the III group varies depending on the direction of the crystal plane, the electric resistance of the clad layer also varies depending on the direction of the crystal layer to provide the semiconductor laser device with desired properties.

Now, the present invention will be described by way of the accompanying drawings that illustrate a preferred embodiment of the invention.

DETAILED DESCRIPTION OF THE PREFERRED EMBODIMENT

Figure 1:
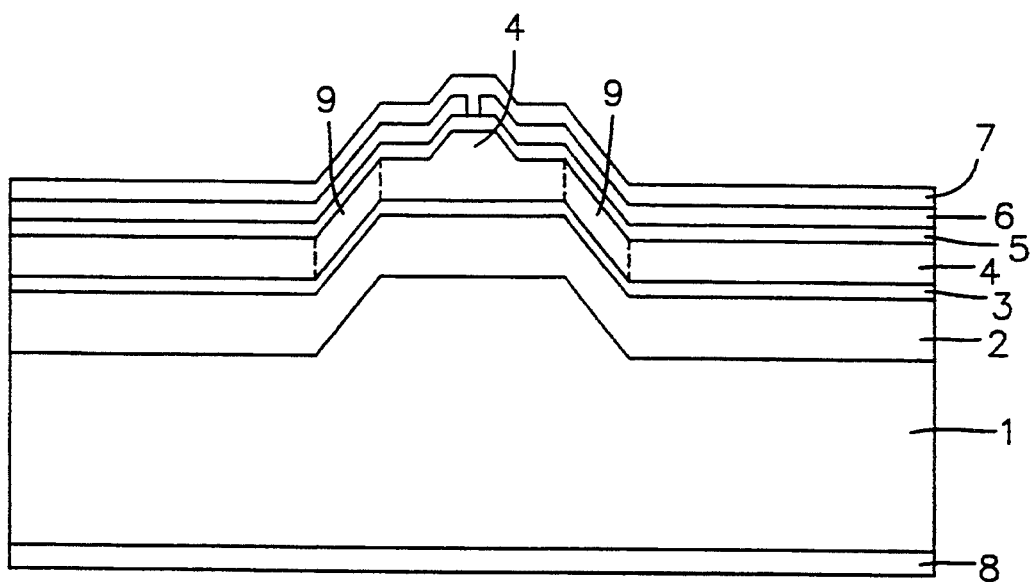
FIG. 1 is a schematic sectional view of a preferred embodiment of the semiconductor laser device of the invention.

A first preferred embodiment of the semiconductor laser device of the present invention is schematically illustrated in FIG. 1 in cross section.

Referring to FIG. 1, the first preferred embodiment of the invention comprises a p-InP lower clad layer 2, a non-doped InGaAs active layer 3, an n-InAlAs upper clad layer 4, an n-InAlAs contact layer 5 and an insulation layer 6 arranged on a p-InP substrate 1 in the above-mentioned order to form a multilayered structure and said upper clad layer 4 is provided with current blocking sections 9.

An n-electrode 7 and a p-electrode 8 are mounted respectively on the insulation layer 6 and on the lower surface of the p-InP substrate 1.

According to the invention, a semiconductor laser device as illustrated in FIG. 1 is prepared in a manner as described below.

The principal crystal plane of the p-InP substrate 1 is a (100) plane.

The p-InP substrate 1 has a mesa which is formed by etching and trapezoidal in cross section and the lateral slopes of the mesa are (111) A planes.

When a substrate 1 having a configuration as described above is set in an MBE apparatus in order to grow crystals on it, the oxide film existing on the surface of the substrate 1 is removed by a preliminary ordinary heat treatment.

The substrate 1 is held to a predetermined position by a holder in the vacuum chamber of the MBE apparatus and molten materials of elements of the III and V groups are held to high temperature in respective effusion cells (molecular beam cells) in the apparatus and Si of the IV group is solidified at 900° C. to 1,200° C.

Among the conditions to be met for crystal growth by a method of manufacturing a semiconductor laser device according to the invention, the growth temperature needs to be kept between 300° and 650° C. and the intensity of molecular beam of the V group should be 2 to $10^2$ times as high as that of the III group.

To begin with, the shutters of the effusion cells of the elements of a lower clad layer 2 are made open to allow atoms of the elements to burst out, collide and eventually get to the substrate 1 to form semiconductive crystals, which then grow to form a complete Be-doped p-InAlAs lower clad layer 2.

Then, atoms of the elements of an active layer are effused from the respective effusion cells of the elements to form crystals of a non-doped InGaAs active layer 4 on the lower clad layer 2. The crystals are then made to grow to become a complete active layer 3 there.

Thereafter, atoms of the elements of an upper clad layer 3 are also sprayed out from the respective effusion cells of the elements to form crystals of an n-InAlAs upper clad layer 4 on the non-doped active layer 3. The crystals are then made to grow to become a complete n-InAlAs upper clad layer 4 there.

It should be noted, however, that the crystal growth of the n-InAlAs upper clad layer 4 is controlled by frequently turning on and off the shutters of the effusion cells.

Figure 2:
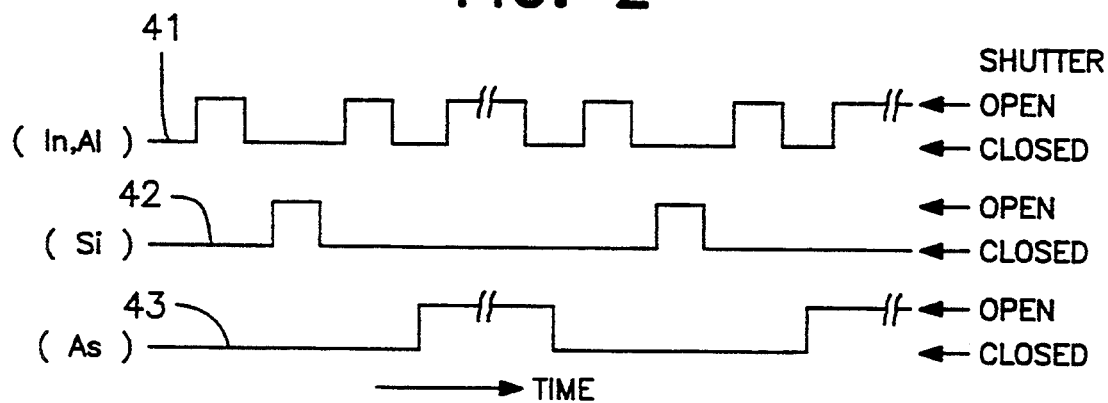
FIG. 2 is a timing chart for opening and closing the shutters of effusion cells for forming an upper clad layer by a method of manufacturing a semiconductor laser device according to the invention.

FIG. 2 shows a timing chart of opening and closing the shutters.

In each line of FIG. 2, the higher level indicates a condition where the shutter of the effusion cell is open, whereas the lower level indicates a condition where the shutter of the effusion cell is closed.

Of the three lines of FIG. 2, the uppermost line 41 represents a first effusion cell that contains In and Al, both of which belong to the III group, the middle line 42 represents a second effusion cell containing Si and the lowermost line 43 represents a third effusion cell containing As.

The first effusion cell 41 is, however, divided into two compartments, one for In and the other for Al.

Referring to FIG. 2, first of all, the first effusion cell 41 is made open to let out atoms of the elements of the III group to cover the surface for crystal growth. When the surface for crystal growth is completely covered by atoms of the elements of the III group approximately by a monolayer, the first effusion cell 41 is closed. Thereafter, the second effusion cell containing Si which is a dopant is made open instantaneously and quickly closed again. Then, the first effusion cell 41 is opened again in order to cover the dopant Si with atoms of the elements of the III group. The first effusion cell 41 is closed again when the dopant Si is covered by the elements of the III group.

Now, the Si is sandwiched by the elements of the III group.

With such an arrangement, since each of the Si atoms can be easily combined with one or more of the atoms of the elements of the III group, the Si atoms are highly probably taken into the sites of As atoms.

Finally, the third effusion cell 43 is made open for a predetermined period of time to let out As atoms in order to accelerate the growth of non-doped InAlAs.

The above described steps of opening and closing the effusion cells constitute a crystal growth cycle, which is then repeated for several to several thousand times to complete the operation of producing a complete n-InAlAs upper clad layer 4.

An n-InAlAs upper clad layer 4 prepared in this manner has an InAlAs layer having a high electric resistance on each of the lateral slopes of the mesa. Then, a current blocking section 9 is formed in part of each of the highly resistive InAlAs layers.

It should be noted here that the electric resistance of each of the current blocking sections 9 formed on the (111) A planes or the lateral slopes of the mesa is greater than that of the (100) plane or the top of the mesa approximately by $10^2$ to $10^6$ times.

After forming an n-InAlAs upper clad layer 4, an n-InAlAs contact layer 5 is made to grow on it by a known technique. Thereafter, an insulation layer 6 is formed thereon by using, for instance, a plasma CVD technique.

Then an oblong n-electrode 7 is arranged on the insulation layer by any known photolithography technique and a p-electrode 8 is arranged on the lower surface of the p-InP substrate 1 by known means.

Now, the relationship between the electric resistance and the direction of crystal plane of an Si-doped InAlAs layer will be described by way of an example and a comparative example obtained as a result of an experiment.

In the example, where an Si-doped InAlAs layer was formed on each Fe-doped semiinsulated InP substrate having a normal mesa by using the above described technique of opening and closing effusion cells (means for doping a surface selectively with elements of the III group), a number or substrates were prepared in advance, including those having a principal plane agreeing with the (100) plane, those having a principal plane misoriented by 1° and 2° respectively from the (100) plane, those having a principal plane agreeing with the (111) A plane and those having a principal plane misoriented by respectively 1° and 2° from the (111) A plane, on each of which the above described layer was formed.

The temperature of the substrate was kept to 400° C. during the experiment.

In the comparative example, where, an Si-doped InAlAs layer was grown on each Fe-doped semiinsulated InP substrate by means of a known technique of using effusion cells respectively containing In, Al, As and Si which were simultaneously made open for doping (bulk doping means), a number or substrates were prepared in advance as in the case of the example described above, including those having a principal plane agreeing with the (100) plane, those having a principal plane misoriented by 1° and 2° respectively from the (100) plane, those having a principal plane agreeing with the (111) A plane and those having a principal plane misoriented by respectively 1° or 2° from the (111) A plane, on each of which the above described layer was formed.

Figure 3:
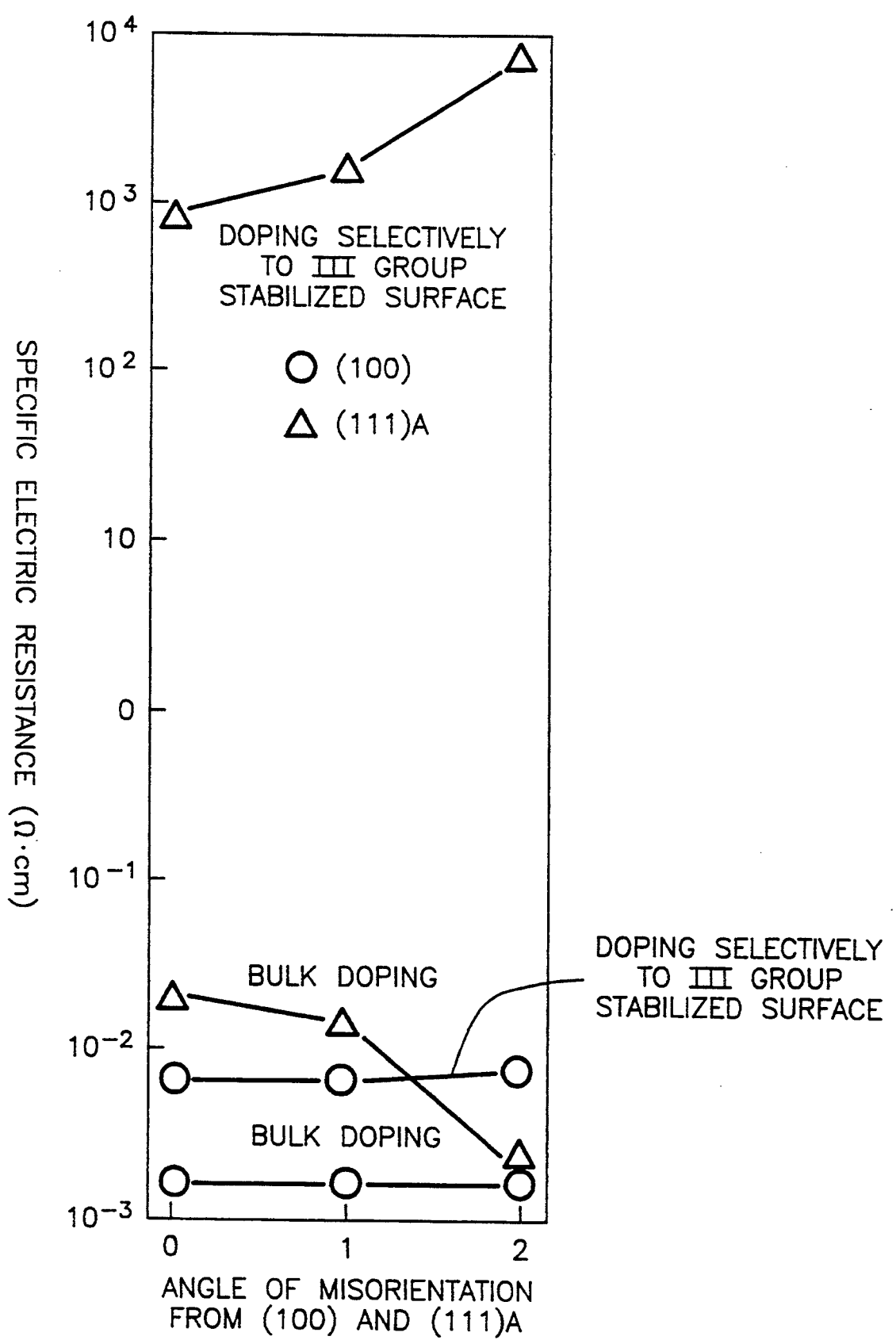
FIG. 3 is a graph showing the relationship between the angle of deviation from the crystal plane and the electric resistance for an Si-doped InAlAs layer formed on an Fe-doped semiinsulated InP substrate having a normal mesa.
Figure 4:
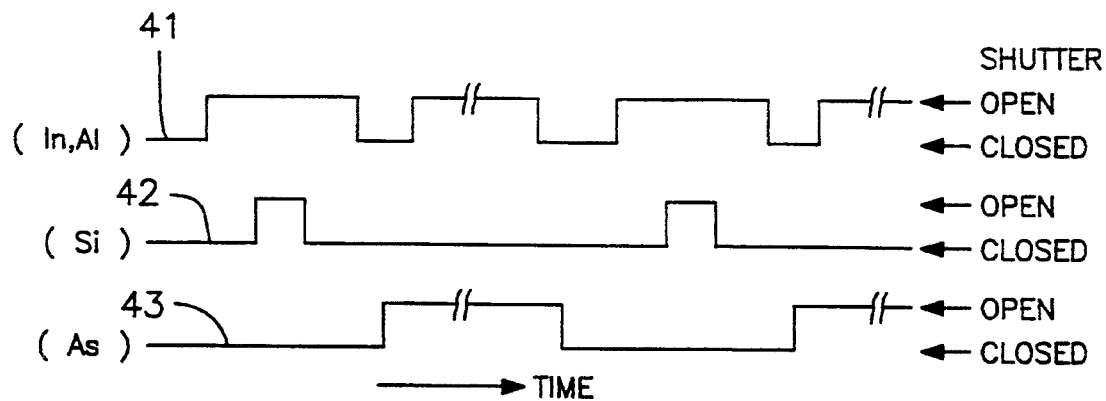
FIGS. 4 through 8 are alternative timing charts for opening and closing effusion cells for forming an upper clad layer by a method according to the invention.
Figure 5:
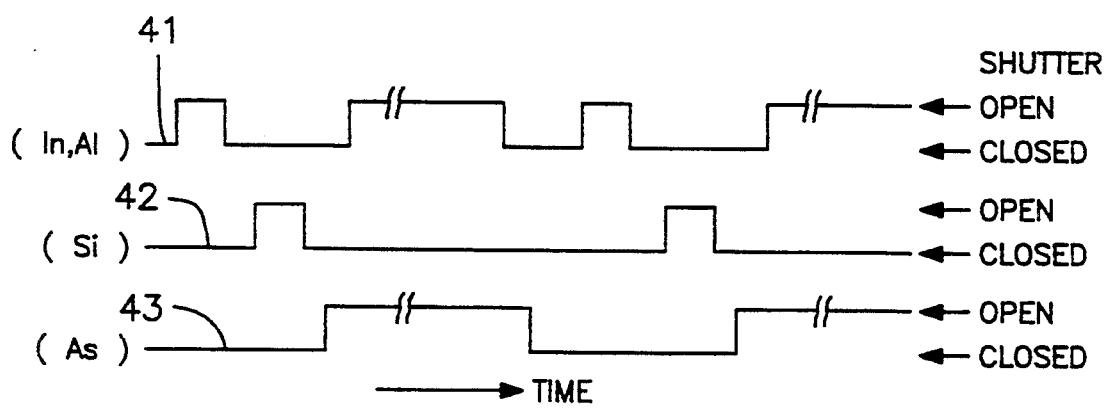
Figure 6:
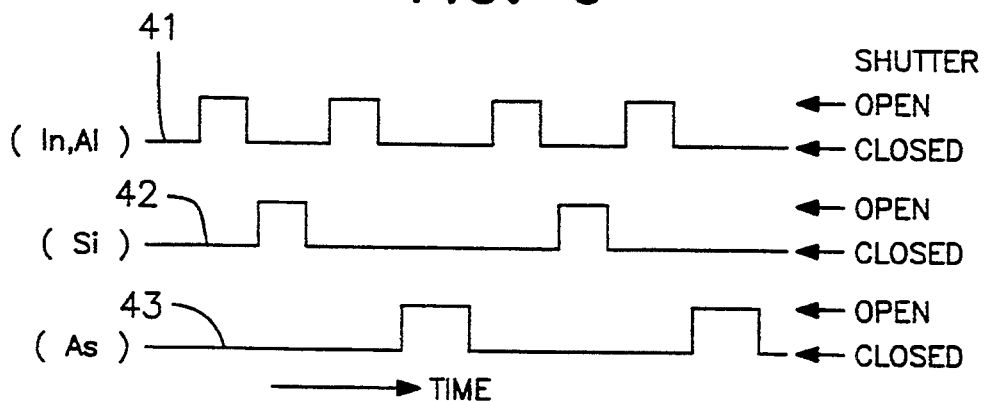
Figure 7:
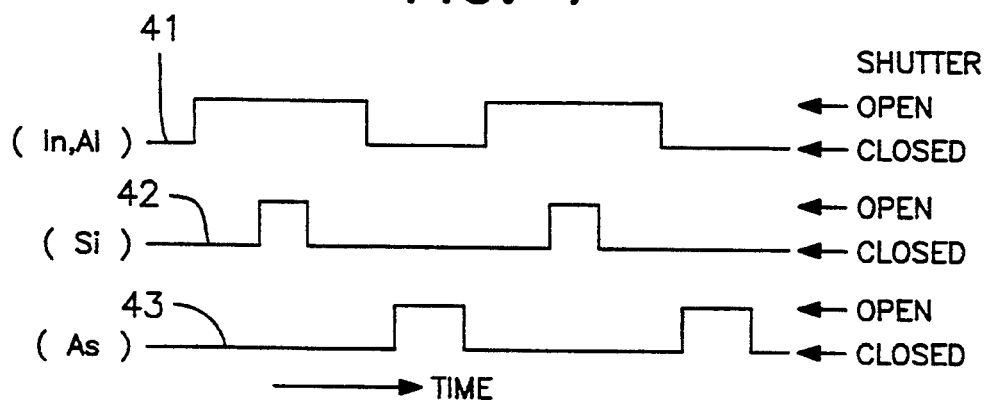
Figure 8:
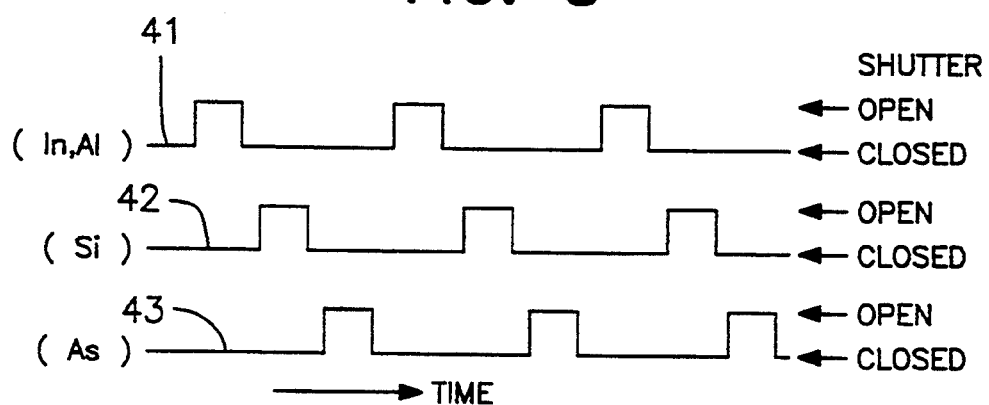
Figure 9:
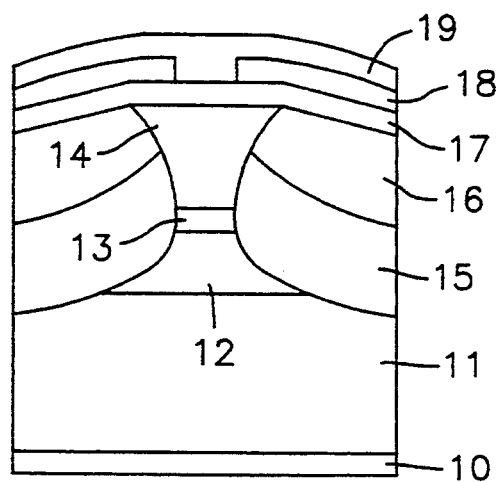
FIG. 9 is a schematic sectional view of a conventional semiconductor laser device.
Figure 10:
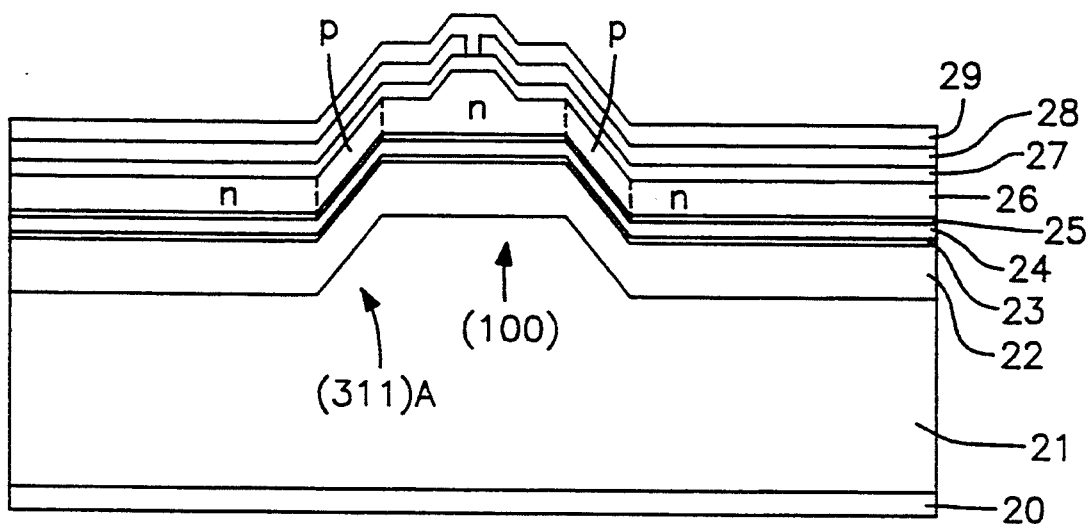
FIG. 10 is a schematic sectional view similar to FIG. 9 but showing still another conventional semiconductor laser device.

The electric resistance of each of the samples obtained in the example and the comparative example was measured. FIG. 3 shows the result of the measurement.

As clearly seen from FIG. 3, the Si-doped InAlAs formed on the (111) A plane (that corresponds to the side slopes of the mesa) of the samples of the example showed a specific electric resistance greater than that of the top of the mesa by $10^5$, whereas the difference of specific electric resistance between the side slopes and the top of the mesa of the samples of the comparative example was by far lower than that of the sample of the example.

For the purpose of the present invention, it should be noted that the following technological particulars are found within the scope of the invention.

The direction of the principal plane of the substrate may be misoriented approximately by 5° from that of the (100) plane.

The plane of each of the side slopes of the mesa may be a (111) A plane, a (211) A plane, a (311) A plane, a (411) A plane or a (511) A plane. The direction of the plane of each of the side slopes of the mesa may be misoriented approximately by 5° from that of any of these planes.

The side slopes of the mesa need not be restricted to a crystal A plane and may well comprise a crystal B plane.

The substrate may alternatively be a GaAs, GaSb, Si or GaAsP substrate and the active layer may alternatively be a quantum well layer or a quaternary layer of InAlGaAs. The upper and/or lower clad layers may alternatively have a SCH, GRIN or GRIN-SCH structure.

AsGaAs and C may be used respectively for the upper clad layer and the amphoteric impurity. Alternatively, AlGaInAs and Si may be used respectively for the upper clad layer and the amphoteric impurity.

Timing of opening and closing the effusion cells for forming an upper clad layer is not limited to the one shown in FIG. 2 and may be replaced by any of those shown in FIGS. 4, 5, 6, 7 and 8.

Since the timing charts of FIGS. 4 through 8 are similar to that of FIG. 2 and therefore may be easily understood, they will not be described any further here.

As described in detail above, since a semiconductor laser device according to the present invention comprises a lower clad layer, an active layer and an upper clad layer formed on a normal mesa-shaped substrate is characterized in that said upper clad layer is a semiconductive layer made of a compound of elements of the III and V groups doped with an amphoteric impurity substance and that the electric resistance of said lateral slopes is greater on the top of the mesa than on the upper clad layer of the mesa, the injected electric current can be confined on the top of the mesa to consequently reduce the threshold current level when starting laser oscillation.

As described above, a method of manufacturing a semiconductor laser device according to the invention comprises a step of repeating a cycle of crystal growth operation of sequentially forming a layer of an element of the III group, a layer of an amphoteric impurity substance and a layer of an element of the V group on said substrate by means of an MBE technique to produce said upper clad layer made of a compound of elements of the III and V groups.

Thus, with a method according to the invention, a semiconductor laser device can be prepared by a simple and continuous operation of crystal growth by means of an MBE technique. Since a semiconductor laser device prepared by means of the method of the invention is not subjected to degradation of the crystal quality, unlike the case of a device prepared by a conventional method of crystal growth that require interruptions of the crystal growth operation, the method can effectively provide high-quality semiconductor laser devices.

What is claimed is:

1. A semiconductor laser device comprising a normal mesa-shaped substrate having a top surface and lateral sloped surfaces, a lower clad layer, an active layer and an upper clad layer formed on the substrate and each having a mesa-shape with a top surface and lateral sloped surfaces, said upper clad layer being a semiconductive layer made of a compound of group III and V elements doped with an amphoteric impurity substance such that the electrical resistance of the lateral sloped surfaces of the upper clad layer being at least 100 times greater than the electrical resistance of the top surface of said upper clad layer.

2. A semiconductor laser device according to claim 1, wherein said substrate is made of a semiconductive material.

3. A semiconductor laser device according to claim 2, wherein said substrate is made of InP, GaAs, GaSb or GaAsP.

4. A semiconductor laser device according to claim 1, wherein said substrate is made of InP or Si.

5. A semiconductor laser device according to claim 1, wherein the principal crystal plane of the substrate is a (100) plane.

6. A semiconductor laser device according to claim 1, wherein the crystal plane of the lateral slopes of the mesa is a (111) A plane, a (211) A plane, a (311) A plane, a (411) A plane or a (511) A plane.

7. A semiconductor laser device according to claim 1, wherein the crystal plane of the lateral slope of the mesa is either the A or the B crystal plane.

8. A semiconductor laser device according to claim 1, wherein said active layer is a quantum well layer or a quaternary layer of InAlGaAs.

9. A semiconductor laser device according to claim 1, wherein said upper and/or lower clad layers have a SCH, GRIN or GRIN-SCH structure.

10. A semiconductor laser device according to claim 1, wherein said upper clad layer is made of Si-doped AlGaAs or Si-doped AlGaInAs.

11. A semiconductor laser device according to claim 1, wherein said amphoteric impurity substance is Si or C.

* * * * *